United States Patent
Hu et al.

(10) Patent No.: US 12,243,749 B2
(45) Date of Patent: Mar. 4, 2025

(54) METHODS TO PROVIDE UNIFORM WET ETCHING OF MATERIAL WITHIN HIGH ASPECT RATIO FEATURES PROVIDED ON A PATTERNED SUBSTRATE

(71) Applicant: Tokyo Electron Limited, Tokyo (JP)

(72) Inventors: Shan Hu, Albany, NY (US); Henan Zhang, Albany, NY (US); Sangita Kumari, Albany, NY (US); Peter Delia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 374 days.

(21) Appl. No.: 17/952,613

(22) Filed: Sep. 26, 2022

(65) Prior Publication Data
US 2024/0105455 A1    Mar. 28, 2024

(51) Int. Cl.
*H01L 21/306* (2006.01)
(52) U.S. Cl.
CPC ............... *H01L 21/30604* (2013.01)
(58) Field of Classification Search
None
See application file for complete search history.

(56) References Cited

U.S. PATENT DOCUMENTS

| | | | |
|---|---|---|---|
| 3,979,241 A | 9/1976 | Maeda et al. | |
| 9,406,683 B2 | 8/2016 | Arndt et al. | |
| 9,698,153 B2 | 7/2017 | Liu et al. | |
| 10,886,165 B2 | 1/2021 | Singh et al. | |
| 2018/0090325 A1 | 3/2018 | Yoon et al. | |
| 2018/0138053 A1 | 5/2018 | Yao et al. | |
| 2020/0148949 A1 | 5/2020 | Xu et al. | |
| 2022/0051938 A1 | 2/2022 | Wu et al. | |
| 2022/0098485 A1 | 3/2022 | Vereecke | |
| 2024/0096638 A1* | 3/2024 | Hu | H01L 21/31111 |
| 2024/0295030 A1* | 9/2024 | Kimura | C23F 1/26 |

FOREIGN PATENT DOCUMENTS

| | | |
|---|---|---|
| JP | 2000306888 | 11/2000 |
| KR | 20080075648 | 8/2008 |
| KR | 20210154506 | 12/2021 |

OTHER PUBLICATIONS

Ueda, "Effect of Hydrophobicity and Surface Potential of Silicon on SiO2 Etching in Nonometer-Sized Narrow Spaces", Trans Tech Publications, 2021, 6 pgs.

(Continued)

*Primary Examiner* — Allan W. Olsen
(74) *Attorney, Agent, or Firm* — Egan, Enders & Huston LLP.

(57) ABSTRACT

Embodiments of a wet etch process and methods are disclosed herein to provide uniform wet etching of material within high aspect ratio features. In the present disclosure, a wet etch process is used to etch material within high aspect ratio features, such as deep trenches and holes, provided on a patterned substrate. Uniform wet etching is provided in the present disclosure by ensuring that wall surfaces of the material being etched (or wall surfaces adjacent to the material being etched) exhibit a neutral surface charge when exposed to the etch solution used to etch the material.

20 Claims, 10 Drawing Sheets

(56) References Cited

OTHER PUBLICATIONS

Watanabe et al., "High Selectively (SiN/SiO2) Etching Using an Organic Solution Containing Anhydroud HF", Microelectronic Engineering, 2009, 1 pg.
Okuyama et al., "Impact of Electrostatic Effects on Wet Etching Phenomenon in Nanoscale Region", Trans Tech Publications, 2015, 5 pgs.
Polster et al., "The Electrical-Double Layer Revisted", Natural Sciences, Dec. 2021, 10 pgs.
Zubel et al., "Silicon Anisotropic Etching in Alkaline Solutions IV: The Effect of Organic and Inorganic Agents on Silicon Anisotropic Etching Process", Sensors and Actuators a Physical, Jan. 2001, 1 pg.
MicroChemicals, "Wet-Chemical Etching of Silicon and Sio2", Anisotropic Etching of Silicon, Basics of Microstructuring, Obtained from Internet Jul. 12, 2022, 7 pgs.
MicroChemicals, "Wet Chemical Etching—Basics", Basics of Microstructuring, Obtained from Internet Jul. 12, 2022, 8 pgs.
Virginia Semiconductor, "Wet-Chemical Etching and Cleaning of Silicon", Jan. 2003, 11 pgs.
Li et al., "Evaluvation on Dispersion Behavior of the Aqueous Copper Nano-Suspensions", Journal of Colloid and Interface Science, Mar. 2007, 9 pgs.
Vereecke et al., "Wet Etching of TiN in 1-D and 2-D Confined Nano-spaces of FinFET", Microelectronic Engineering, 2018, 7 pgs.
Hu et al., Wet Etch Process and Method to Provide Uniform Etching of Material Formed Within Features Having Different Critical Dimension (CD), U.S. Appl. No. 17/942,359, filed Sep. 12, 2022, 54 pgs.
Search Report and the Written Opinion mailed Dec. 11, 2023, Application No. PCT/US2023/030666, Filed Aug. 21, 2023, 8 pgs.

\* cited by examiner

1200 ⇘

> Providing a patterned substrate having at least one feature formed within a stack of material layers comprising alternating layers of a first material layer and a second material layer; and — 1210

> Exposing the patterned substrate to an etch solution to etch the second material layer without etching the first material layer, wherein the etch solution comprises reactive ions and has a pH value;
>
> wherein when exposed to the etch solution, wall surfaces of the first material layer adjacent to the second material layer being etched exhibit a neutral surface charge substantially equal to 0mV at the pH of the etch solution, and wherein as a result of the neutral surface charge, a uniform concentration of the reactive ions is maintained within the at least one feature and uniform etching of the second material layer is provided along a depth of the at least one feature. — 1220

*FIG. 12*

METHODS TO PROVIDE UNIFORM WET ETCHING OF MATERIAL WITHIN HIGH ASPECT RATIO FEATURES PROVIDED ON A PATTERNED SUBSTRATE

BACKGROUND

The present disclosure relates to the processing of substrates. In particular, it provides methods to provide uniform wet etching of material within features having high aspect ratio.

Semiconductor device formation typically involves a series of manufacturing techniques related to the formation, patterning, and removal of layers of material on a substrate. During routine semiconductor fabrication, various materials formed on a substrate may be removed by patterned etching, chemical-mechanical polishing, as well as other techniques. A variety of techniques are known for etching layers on a substrate, including plasma-based or vapor-phase etching (otherwise referred to as dry etching) and liquid based etching (otherwise referred to as wet etching).

Wet etching generally involves dispensing a chemical solution over the surface of a substrate or immersing the substrate in the chemical solution. The chemical solution (otherwise referred to herein as an etch solution) often contains a solvent and etchant chemical(s) designed to react with materials on the substrate surface and promote dissolution of the reaction products. As a result of exposure of the substrate surface to the etch solution, material is removed from the substrate. The composition and temperature of the etch solution may be controlled to control the etch rate, specificity, and residual material on the surface of the substrate post-etch.

As geometries of substrate structures continue to shrink and the types of structures evolve, the challenges of etching substrates have increased. One such challenge is non-uniform wet etching of material within deep trenches and holes, or other high aspect ratio features, provided on a patterned substrate. When a wet etch process is utilized to etch material within high aspect ratio features, the etch rate of the material being etched may vary from the top to the bottom (i.e., along the depth) of the features. The uneven etch rate within the features may cause various problems, such over etching, under etching and/or critical dimension (CD) variations along the depth of the features. As such, a need remains to provide wet etch processes and methods that provide uniform wet etching of material within high aspect ratio features.

SUMMARY

The present disclosure provides various embodiments of processes and methods that provide uniform wet etching of material within high aspect ratio features. In the present disclosure, a wet etch process is used to etch material within high aspect ratio features, such as deep trenches and holes, provided on a patterned substrate. Uniform wet etching is provided in the present disclosure by ensuring that wall surfaces of the material being etched (or wall surfaces adjacent to the material being etched) exhibit a neutral surface charge when exposed to the etch solution used to etch the material.

When an etch solution is used to remove the material within the high aspect ratio features (e.g., trenches and holes), the rate at which the material is removed (i.e., the etch rate) may differ depending on a variety of factors, such as the critical dimension (CD), depth and/or aspect ratio of the features, the etchant chemical(s) used within the etch solution, the solvent(s) used within the etch solution, the ratio of etchant chemical(s) to solvent(s) used within the etch solution, the pH of the etch solution and the material being etched. When a wet etch process is used to etch material within features having a high aspect ratio (AR=depth:CD) greater than or equal to 5, the etch rate within the features may vary significantly along the depth of the features. The difference in etch rate that occurs along the depth of high aspect ratio features is known in the art as AR-dependent etching.

When a patterned substrate is exposed to an etch solution containing anions (negatively charge ions) and cations (positively charged ions), wall surfaces of the material being etched (or wall surfaces adjacent to the material being etched) may attain a positive, negative or neutral surface charge, depending on the material composition of the wall surfaces and the pH of the etch solution. Wall surfaces exhibiting positive surface charge (e.g., a surface charge substantially greater than 0 mV) in the presence of the etch solution may attract the anions and repel the cations within the etch solution. On the other hand, wall surfaces exhibiting negative surface charge (e.g., a surface charge substantially less than 0 mV) in the presence of the etch solution may attract the cations and repel the anions within the etch solution. The electrostatic forces between the charged wall surfaces and the reactive ions in the etch solution change the local concentration of the anions/cations within the features, which in turn, may affect (increase or decrease) the etch rate within the features. This difference in etch rate results in non-uniform wet etching along the depth of the features, which may worsen as the etch depth or aspect ratio increases.

As known in the art, anions or cations may be used as the main reactive species (i.e., the reactive ions within the etch solution responsible for reacting with and removing the material within the features). When the main reactive species contained within the etch solution is repelled by a charged wall surface, the repulsive force between the charged wall surface and the main reactive species may decrease the local concentration of the main reactive species within the features, causing fewer and fewer reactive ions to reach the etch depth as the etch depth increases. This may decrease the etch rate as etching progresses, resulting in a non-uniform etch rate along the depth of the features. The opposite may be true when the main reactive species contained within the etch solution is attracted by the charged wall surface.

The present disclosure provides uniform wet etching of material within high aspect ratio features by ensuring that wall surfaces of the material being etched (or wall surfaces adjacent to the material being etched) exhibit a neutral surface charge (e.g., a surface charge substantially equal 0 mV) when exposed to the etch solution used to etch the material. The neutral surface charge reduces or eliminates the electrostatic forces, which would otherwise occur between the reactive ions in the etch solution and a charged wall surface. By preventing the wall surfaces of the material being etched (or wall surfaces adjacent to the material being etched) from attaining a substantially positive or negative surface charge, the wet etch process and methods disclosed herein maintain a uniform concentration of reactive species within the features and provide a uniform etch rate along the depth of the features.

In the embodiments disclosed herein, the etch solution used to etch the material is selected to ensure that the wall surfaces of the material being etched (or wall surfaces adjacent to the material being etched) remain uncharged when exposed to the etch solution. In some embodiments, the etch solution used to etch the material may include one or more etchant chemicals mixed with an organic solvent and an aqueous solvent, and the particular etchant chemical(s) and organic solvent used in the etch solution, as well as the ratio between the etchant chemical(s), organic solvent and aqueous solvent used, may be selected to ensure that the wall surfaces of the material being etched (or wall surfaces adjacent to the material being etched) exhibit a neutral surface charge in the presence of the etch solution. If electroneutrality is not obtained at the pH of the etch solution, the pH of the etch solution may be adjusted and/or surfactant(s) may be added to adjust the surface potential of the wall surfaces to achieve electroneutrality.

According to one embodiment, a method of etching is provided herein that utilizes the techniques described in the present disclosure. In some embodiments, the method may begin by providing a patterned substrate having at least one feature formed within a material layer formed on the patterned substrate, wherein the at least one feature has a critical dimension (CD) and an etch depth, and exposing the patterned substrate to an etch solution to etch the material layer and increase the CD and the etch depth of the at least one feature. The etch solution may include reactive ions and may have a pH value. When exposed to the etch solution, wall surfaces of the material layer being etched may exhibit a neutral surface charge substantially equal to 0 mV at the pH value of the etch solution. As a result of the neutral surface charge, a uniform concentration of the reactive ions is maintained within the at least one feature and uniform etching is provided along the etch depth of the at least one feature.

In some embodiments, the method may further include continuing etching the material layer with the etch solution until the at least one feature reaches a target etch depth. In such embodiments, said exposing the substrate to the etch solution and said continuing etching the material layer with the etch solution may provide a uniform etch rate from a top of the at least one feature to the target etch depth. In some embodiments, the at least one feature may be a high aspect ratio feature. For example, the at least one feature may have an aspect ratio greater than or equal to 5.

In some embodiments, the etch solution may include one or more etchant chemicals, an organic solvent and an aqueous solvent. The one or more etchant chemicals may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may include one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

In some embodiments, the method described herein may further include adjusting the pH value of the etch solution to ensure that the wall surfaces of the material layer being etched exhibit the neutral surface charge at the pH value of the etch solution. In some embodiments, the method described herein may further include adding a surfactant to the etch solution to ensure that the wall surfaces of the material layer being etched exhibit the neutral surface charge at the pH value of the etch solution.

In the method described above, the material layer being etched may be a silicon-containing layer or a metal layer. For example, the silicon-containing layer may include, but is not limited to, amorphous silicon (a-Si), polysilicon (poly-Si), silicon nitride (SiN), silicon carbon nitride (SiCN) or silicon oxynitride (SiON). The etch solution used to etch such material layers may generally include one or more etchant chemicals mixed with an organic solvent and an aqueous solvent. In one example embodiment, the one or more etchant chemicals may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), the aqueous solvent may be water, and the organic solvent may be isopropyl alcohol ($C_3H_8O$), propylene carbonate ($C_4H_6O_3$), acetic acid ($CH_3COOH$) or ethylene glycol ($C_2H_6O_2$).

According to another embodiments, another method of etching is provided herein that utilizes the techniques described in the present disclosure. In some embodiments, the method may begin by providing a patterned substrate having at least one feature formed within a stack of material layers comprising alternating layers of a first material layer and a second material layer. Next, the method may include exposing the patterned substrate to an etch solution to etch the second material layer without etching the first material layer. The etch solution may generally include reactive ions and may have a pH value. When exposed to the etch solution, wall surfaces of the first material layer adjacent to the second material layer being etched may exhibit a neutral surface charge substantially equal to 0 mV at the pH of the etch solution. As a result of the neutral surface charge, a uniform concentration of the reactive ions is maintained within the at least one feature and uniform etching of the second material layer is provided along a depth of the at least one feature.

In some embodiments, the stack of material layers may include alternating layers of a first silicon-containing layer and a second silicon-containing layer utilized within a three-dimensional memory device, wherein the second silicon-containing layer differs from the first silicon-containing layer. In other embodiments, the stack of material layers may include alternating layers of a first silicon-containing layer and a second silicon-containing layer utilized within a transistor nano-sheet, and wherein the second silicon-containing layer differs from the first silicon-containing layer.

In some embodiments, the etch solution may generally include one or more etchant chemicals mixed with an organic solvent and an aqueous solvent. For example, the one or more etchant chemicals may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may include one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

In some embodiments, the method described herein may further include adjusting the pH value of the etch solution to ensure that the wall surfaces of the first material layer exhibit the neutral surface charge at the pH value of the etch solution. In some embodiments, the method described herein may further include adding a surfactant to the etch solution to ensure that the wall surfaces of the first material layer exhibit the neutral surface charge at the pH value of the etch solution.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 12 is a flowchart diagram illustrating another embodiment of a method of etching that utilizes the techniques described herein.

DETAILED DESCRIPTION

The present disclosure provides various embodiments of processes and methods that provide uniform wet etching of material within high aspect ratio features. In the present disclosure, a wet etch process is used to etch material within high aspect ratio features, such as deep trenches and holes, provided on a patterned substrate. Uniform wet etching is provided in the present disclosure by ensuring that wall surfaces of the material being etched (or wall surfaces adjacent to the material being etched) exhibit a neutral surface charge when exposed to the etch solution used to etch the material.

When an etch solution is used to remove material within high aspect ratio features (such as, e.g., deep trenches and holes), the rate at which the material is removed (i.e., the etch rate) may differ depending on a variety of factors, such as the critical dimension (CD), depth and/or aspect ratio of the features, the etchant chemical(s) used within the etch solution, the solvent(s) used within the etch solution, the ratio of etchant chemical(s) to solvent(s) used within the etch solution, the pH of the etch solution and the material being etched. When a wet etch process is used to etch material within features having a high aspect ratio (AR=depth:CD) greater than or equal to 5, the etch rate within the features may vary significantly along the depth of the features. The difference in etch rate that occurs along the depth of high aspect ratio features is known in the art as AR-dependent etching.

Figure 1A:
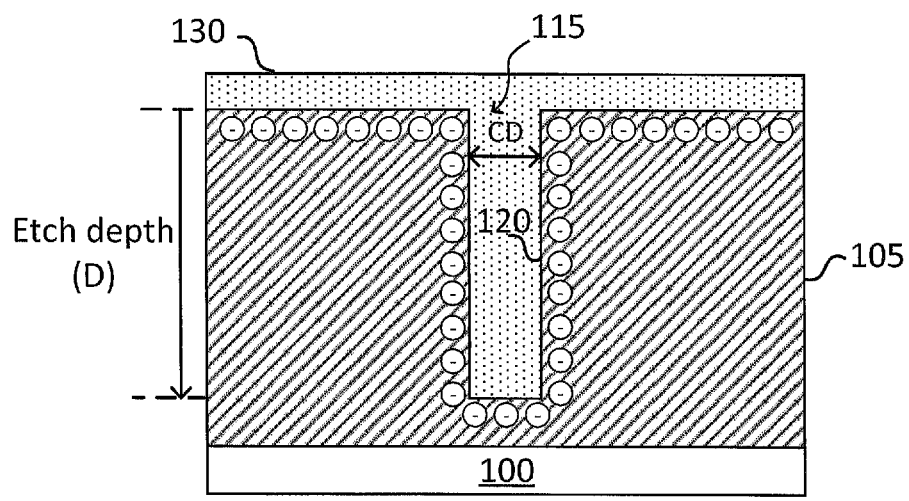
FIG. 1A is a cross-sectional view through a substrate having at least one material layer formed thereon, wherein the substrate is exposed to an aqueous-based etch solution to etch a high aspect ratio feature within the at least one material layer.
Figure 1B:
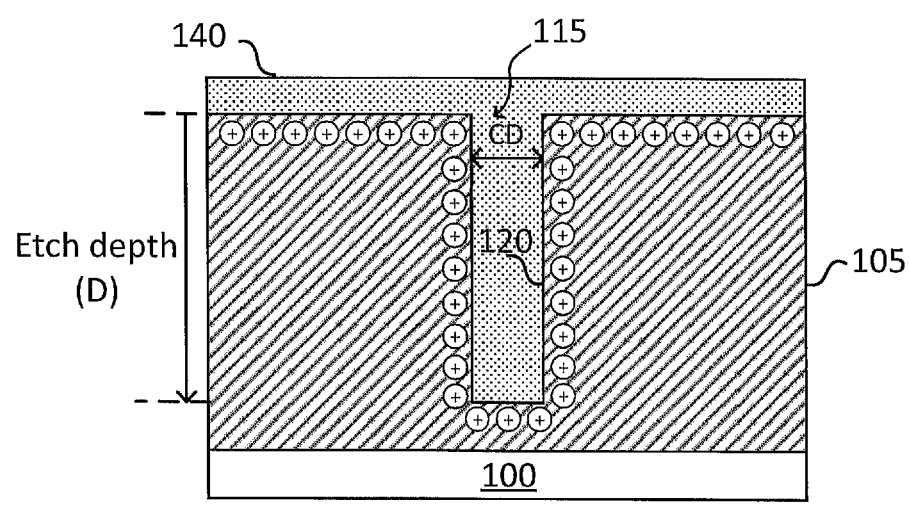
FIG. 1B is a cross-sectional view through a substrate having at least one material layer formed thereon, wherein the substrate is exposed to a non-aqueous organic-based etch solution to etch a high aspect ratio feature within the at least one material layer.

FIGS. 1A-1B illustrate AR-dependent etching of material within high aspect ratio features. In the illustrated embodiments, a patterned substrate 100 having at least one feature 115 formed within a material layer 105 is exposed to an aqueous-based etch solution 130 (in FIG. 1A) and a non-aqueous organic-based etch solution 140 (in FIG. 1B) to etch back the material layer 105 within the at least one feature 115. As used herein, an aqueous-based etch solution 130 is a solution that includes one or more etchant chemicals mixed with an aqueous solvent (e.g., water ($H_2O$) or deionized water). A non-aqueous organic-based etch solution 140, on the other hand, is a solution that includes one or more etchant chemicals mixed with an organic solvent. In some embodiments, the non-aqueous organic-based etch solution 140 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The material layer 105 may include a wide variety of semiconductor materials. For example, the material layer 105 may include one or more silicon-containing materials (such as, e.g., amorphous silicon (a-Si), polysilicon (poly-Si), silicon dioxide ($SiO_2$), silicon nitride (SiN), silicon carbon nitride (SiCN) or silicon oxynitride (SiON)). Other materials, such as conductive materials (such as copper (Cu), aluminum (Al), etc.), may also be utilized for the at least one material layer 105. In some embodiments, the at least one material layer 105 may include a plurality of material layers, wherein one or more of the material layers includes a different material composition.

The at least one feature 115 may include a wide variety of features, such as but not limited to, a deep trench or hole. A critical dimension (CD) of the feature 115 may be relatively small (e.g., less than or equal to 100 nm) compared to the etch depth (D) of the at least feature 115. In some embodiments, the at least one feature 115 may be a high aspect ratio feature that was previously formed within the material layer 105 using, e.g., a dry etch process. As used herein, a high aspect ratio feature may have an aspect ratio (AR=etch depth:CD) greater than or equal to 5.

A wide variety of etch solutions may be utilized to etch back the material 105 within at least one feature 115. In the embodiment shown in FIG. 1A, for example, the patterned substrate 100 is exposed to an aqueous-based etch solution 130 that includes one or more etchant chemicals and an aqueous solvent. As noted above, an aqueous-based etch solution 130 is a solution that includes an etchant chemical mixed with an aqueous solvent (e.g., water ($H_2O$) or deionized water). The etchant chemical(s) included within the aqueous-based etch solution 130 may include anions (negatively charged ions) or cations (positively charged ions) as the main reactive species. Examples of etchant chemicals that include anions as the main reactive species include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). Other etchant chemicals containing anions as the main reactive species may also be utilized.

Figure 5:
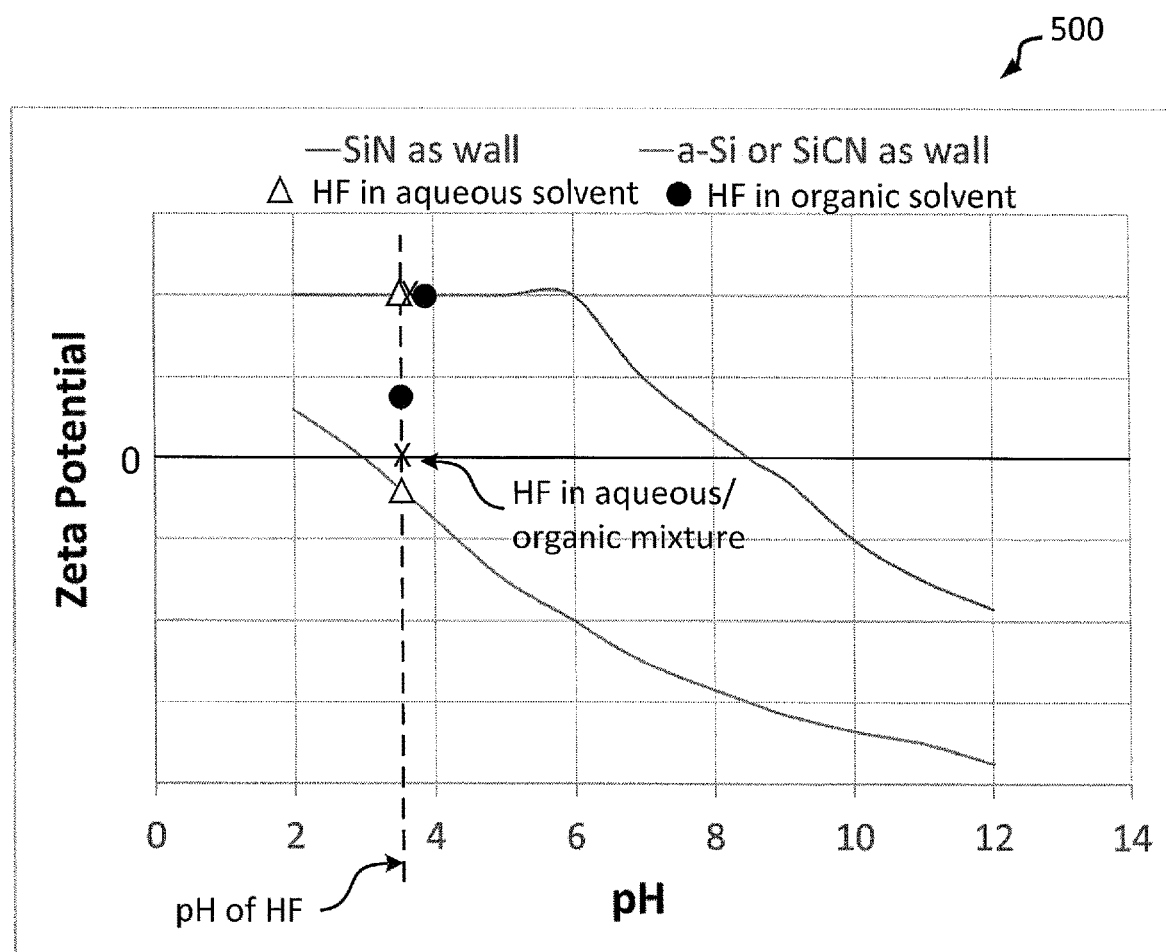
FIG. 5 is a graph illustrating Zeta potential vs pH for various etch solutions and wall materials.

When the patterned substrate 100 is exposed to an aqueous-based etch solution 130 containing anions as the main reactive species, wall surfaces 120 of the material layer 105 exposed to the aqueous-based etch solution 130 may exhibit a negative surface charge, as shown in FIG. 1A, depending on the pH of the etch solution and the material composition of the wall surfaces 120. For example, the exposed wall surfaces 120 of the material layer 105 may exhibit a negative surface charge (as shown in FIG. 1A) when the patterned substrate 100 is exposed to an aqueous-based etch solution 130 containing hydrofluoric acid (HF) mixed with water and the wall surfaces 120 include a silicon-containing material (such as a-Si, poly-Si, $SiO_2$, SiCN or SiON) or a conductive material (such as Cu or Al). However, other silicon-containing materials, such as silicon nitride (SiN), may exhibit a positive surface charge (not shown in FIG. 1A) when the patterned substrate 100 is exposed to an aqueous-based etch solution 130 containing hydrofluoric acid (HF) mixed with water. This is shown in FIG. 5 and described in more detail below.

When the patterned substrate 100 is exposed to an aqueous-based etch solution 130, as shown in FIG. 1A and described above, the anions within the etchant chemical are repelled by the negatively charged wall surfaces 120. This decreases the local concentration of anions within the feature 115, which in turn, decreases the etch rate of the material layer 105. As etching progresses to increase the CD and/or the etch depth (D) of the feature 115, the repulsive force between the anions and the negatively charged wall surfaces 120 may further decrease the local concentration of anions within the feature 115, causing fewer and fewer anions to reach the bottom of the feature 115, which causes the etch rate to be lower near the bottom of the feature 115 than the etch rate achieved near the top of the feature. This may result in under etching, causing CD variations along the depth of the feature 115.

In the embodiment shown in FIG. 1B, the patterned substrate 100 is exposed to a non-aqueous organic-based etch solution 140 that includes one or more etchant chemicals mixed with an organic solvent. The etchant chemical(s) included within the non-aqueous organic-based etch solution 140 may include anions (negatively charged ions) or cations (positively charged ions) as the main reactive species. Examples of etchant chemicals that include anions as the main reactive species are provided above.

A wide variety of organic solvents may be used within the non-aqueous organic-based etch solution 140. Examples of organic solvents that may be included within the non-aqueous organic-based etch solution 140 include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_5H_{10}O_3$), ethanolamine ($C_2H_7NO$) and propylene glycol methyl ether acetate ($C_6H_{12}O_3$).

When the patterned substrate 100 is exposed to a non-aqueous organic-based etch solution 140 containing anions as the main reactive species, wall surfaces 120 of the material layer 105 exposed to the non-aqueous organic-based etch solution 140 may exhibit a positive surface charge, as shown in FIG. 1B, depending on the pH of the etch solution and the material composition of the wall surfaces 120. For example, the exposed wall surfaces 120 of the material layer 105 may exhibit a positive surface charge (as shown in FIG. 1B) when the patterned substrate 100 is exposed to a non-aqueous organic-based etch solution 140 containing hydrofluoric acid (HF) mixed with an organic solvent (e.g., IPA, AA, EG or PC) and the wall surfaces 120 include a silicon-containing material (such as a-Si, poly-Si, $SiO_2$, SiCN or SiON) or a conductive material (such as Cu or Al).

When the patterned substrate 100 is exposed to a non-aqueous organic-based etch solution 140, as shown in FIG. 1B and described above, the anions within the etchant chemical are attracted to the positively charged wall surfaces 120. This increases the local concentration of anions within the feature 115, which in turn, increases the etch rate of the material layer 105. As etching progresses to increase the CD or the etch depth (D) of the feature 115, the attractive force between the anions and the positively charged wall surfaces 120 may further increase the local concentration of anions within the feature 115, causing more and more anions to reach the bottom of the feature 115, which causes the etch rate to be higher near the bottom of the feature 115 than the etch rate achieved near the top of the feature. This may result in over etching, causing CD variations along the depth of the feature 115.

When etching the material layer 105 within the feature 115, the etch rate of the material layer 105 may depend on a variety of factors, including the CD, depth and/or aspect ratio of the feature 115, the particular etchant chemical(s) and/or reactive species used within the etch solution, the particular solvent(s) used within the etch solution, the ratio of etchant chemical(s) to solvent(s) used within the etch solution and/or the pH of the etch solution. In addition to these factors, the electric potential (or surface charge) exhibited by the wall surfaces 120 when exposed to the etch solution may also affect the etch rate of the material layer 105, depending on the particular etch solution used.

Figure 2:
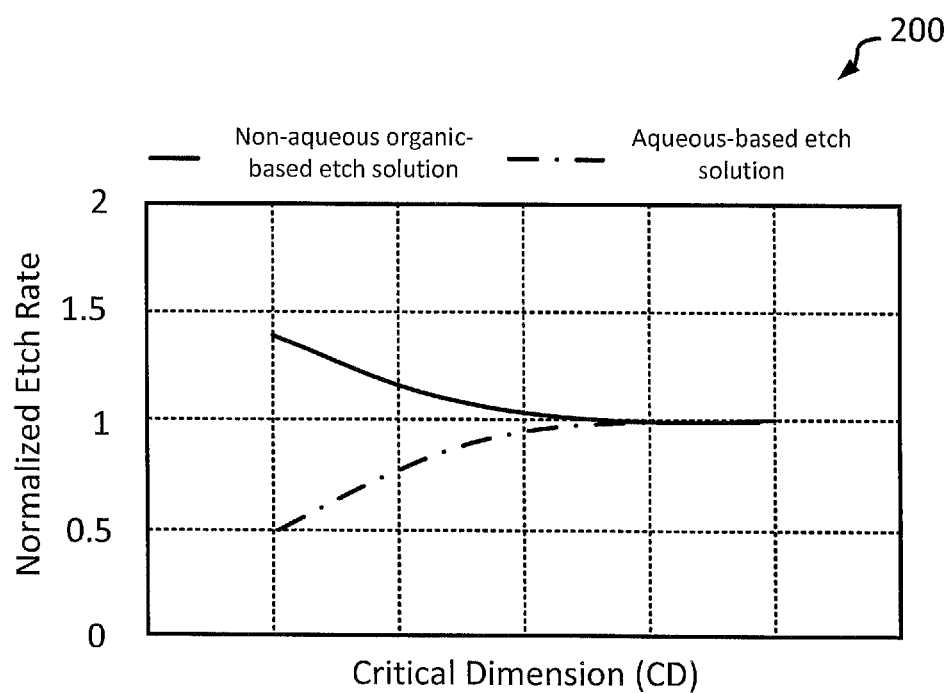
FIG. 2 is a graph illustrating normalized etch rate vs. feature CD when the substrate is exposed to a non-aqueous organic-based etch solution and an aqueous-based etch solution.

As shown in FIGS. 1A-1B and 2, aqueous-based etch solutions 130 and non-aqueous organic-based etch solutions 140 may have the opposite effect on etch rate when: (a) wall surfaces 120 of the material layer 105 being etched exhibit a negative surface charge when exposed to aqueous solutions of certain pH, and (b) anions are used as the main reactive species. When the aqueous-based etch solution 130 shown in FIG. 1A is used to etch the material layer 105, for example, wall surfaces 120 exposed to the etch solution may attain a negative surface charge, which repels the anions within the etch solution and decreases the etch rate within the feature 115. However, when the non-aqueous organic-based etch solution 140 shown in FIG. 1B is used to etch the material layer 105, the wall surfaces 120 exposed to the etch solution may attain a positive surface charge, which attracts the anions within the etch solution and increases the etch rate within the feature 115. This may be due, at least in part, to the Zeta potential and the electric double layer (EDL) that exists between the wall surfaces 120 and the etch solution.

Figure 3:
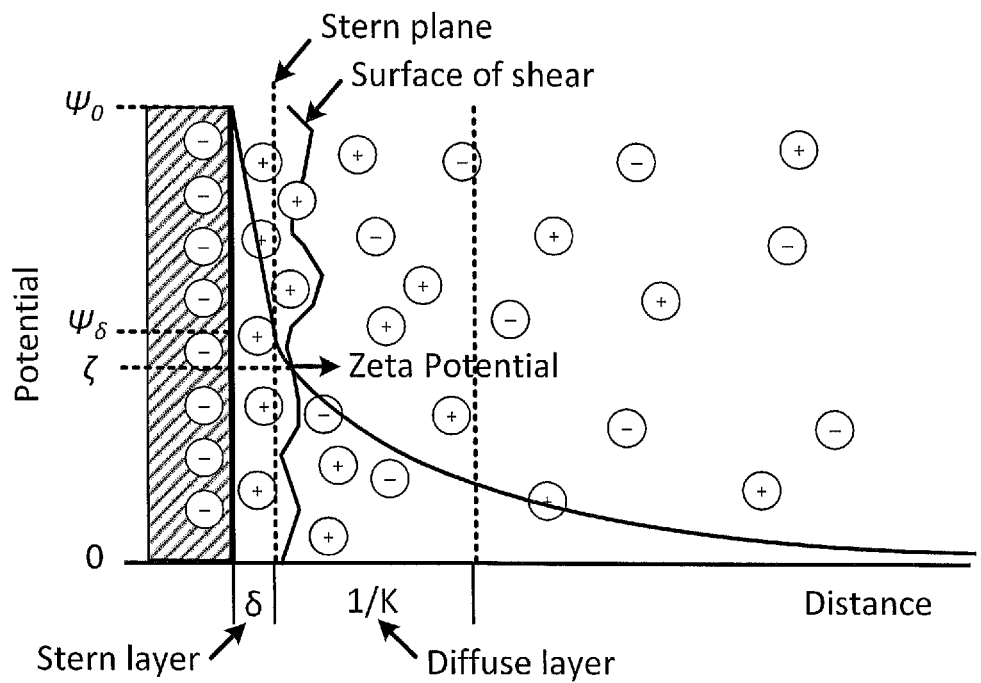
FIG. 3 is a schematic diagram illustrating the Zeta potential and the electric double layer (EDL) that exists between a charged wall surface and the etch solution.

FIG. 3 is a schematic diagram illustrating Zeta potential and the electric double layer that exists between the wall surfaces of a material being etched and the etch solution used to etch the material. As noted above and shown in FIG. 3, the etch solution includes cations (positively charged ions) and anions (negatively charged ions). When the etch solution comes in contact with a wall surface having negative surface potential, as shown in FIG. 3, cations within the etch solution are attracted to and adsorbed onto the wall surface by electrostatic and/or van der Walls forces. The opposite is true when the etch solution comes in contact with a wall surface having positive surface potential (i.e., anions within the etch solution are attracted to and adsorbed onto the wall surface). This attraction produces an electric double layer (i.e., a layer that does not satisfy electroneutrality) between the charged wall surface and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 3, the electric potential ($\Psi$) near the wall surface changes linearly between $\Psi_0$ and $\Psi_\delta$ (the potential at the Stern plane) and decays exponentially with distance from $\Psi_\delta$ to zero in the Diffuse layer and beyond. The Zeta potential ($\zeta$) is the electric potential that exists at the Surface of Shear between the charged wall surface and the etch solution. The Zeta potential ($\zeta$) may be positive, zero or negative, depending on the wall material and the pH of the etch solution.

Figure 4:
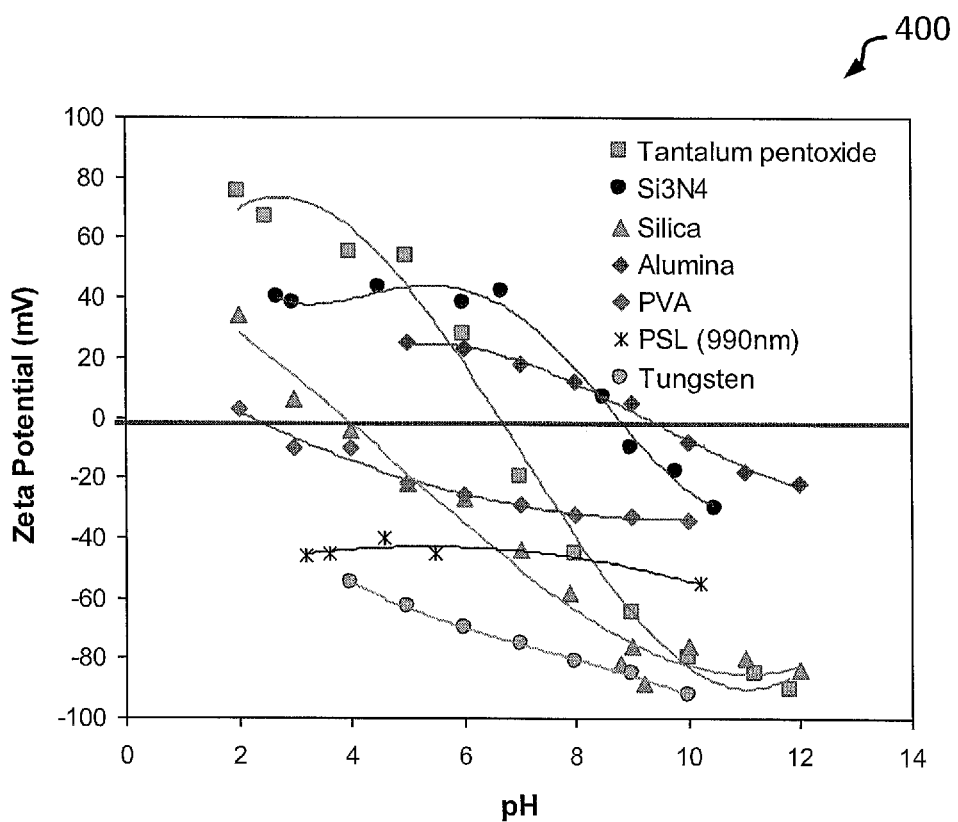
FIG. 4 is a graph illustrating Zeta potential vs pH for various wall materials.

FIG. 4 depicts a graph 400 illustrating Zeta potential (expressed in mV) vs pH for various wall materials. As shown in FIG. 4, the Zeta potential generally increases with decreasing pH and decreases with increasing pH. In some embodiments, the Zeta potential between a charged wall surface and an etch solution can be changed by changing the pH of the etch solution (e.g., by changing the etchant chemical(s) used within the etch solution, or by adding an acid or base to the etch solution), as shown in FIG. 4. In other embodiments, the Zeta potential between a charged wall surface and an etch solution can be changed by adding a surfactant to the etch solution. In yet other embodiments, the Zeta potential between a charged wall surface and an etch solution can be changed by utilizing an etch solution that mixes an etchant chemical with an organic solvent and an aqueous solvent (depending on the pH of the etch solution). This is illustrated in the graph 500 shown in FIG. 5.

The graph 500 shown in FIG. 5 illustrates the Zeta potential vs pH for various etch solutions and wall surface materials (e.g., SiN, a-Si and SiCN). When hydrofluoric acid (HF) is mixed with an aqueous solvent and used as an etch solution, the Zeta potential (denoted with a $\Delta$) between the etch solution and the wall surface material is: (a) negative for a-Si and SiCN (resulting in a negatively charged wall surface), and (b) positive for SiN (resulting in a positively charged wall surface). When hydrofluoric acid (HF) is mixed with organic solvent, instead of an aqueous solvent, the Zeta potential (denoted with a ●) is positive for a-Si, SiCN and SiN (resulting in positively charged wall surfaces). When hydrofluoric acid (HF) is mixed with an organic solvent and an aqueous solvent, the Zeta potential (denoted with an X) is positive for SiN (resulting in positively charged wall surfaces), yet relatively neutral for a-Si and SiCN (resulting in wall surfaces without surface charge).

The graph 500 shown in FIG. 5 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions may have on etch rate when: (a) the material being etched within the features is adjacent to a wall material having a negative surface charge in aqueous solutions of certain pH, and (b) the etchant chemical used within the etch solutions includes anions as the main reactive species.

The graph 500 shown in FIG. 5 further shows that when an etchant chemical is mixed with an organic solvent and an aqueous solvent, the Zeta potential between the etch solution and the wall surface may be neutral, or substantially equal to 0 mV. A neutral surface charge may reduce or eliminate the electrostatic forces, which would otherwise occur between the reactive ions in the etch solution and a positively or negatively charged wall surface. By preventing the wall surfaces of the material being etched from attaining a surface charge, a uniform concentration of reactive species can be maintained within the feature to provide a uniform etch rate along the depth of the feature.

The present disclosure provides various embodiments of processes and methods that provide uniform wet etching of material within high aspect ratio features (such as deep trenches and holes) by ensuring that wall surfaces of the material being etched (or wall surfaces adjacent to the material being etched) exhibit a neutral surface charge when exposed to the etch solution used to etch the material. In some embodiments, the etch solution used to etch the material may include one or more etchant chemicals mixed with an organic solvent and an aqueous solvent, and the particular etchant chemical(s) and organic solvent used in the etch solution, as well as the ratio between the etchant chemical(s), organic solvent and aqueous solvent used, may be selected to ensure that the wall surfaces of the material being etched (or wall surfaces adjacent to the material being etched) exhibit a neutral surface charge (or electroneutrality) at the pH of the etch solution.

Embodiments of the present disclosure may also utilize other techniques to ensure that wall surfaces of the material being etched (or wall surfaces adjacent to the material being etched) exhibit electroneutrality in the presence of the etch solution. In some embodiments, the pH of the etch solution may be adjusted and/or surfactant(s) may be added to adjust the surface potential of the wall surfaces to ensure that the wall surfaces exhibit a neutral surface charge in the presence of the etch solution.

Figure 6A:
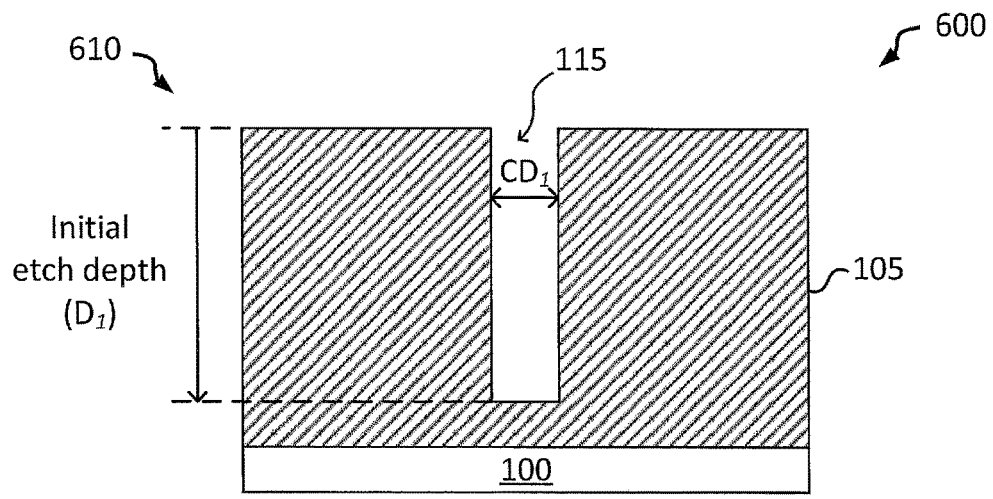
FIGS. 6A-6C illustrate one embodiment of an improved process that uses the techniques described herein to provide uniform wet etching of material within high aspect ratio features provided on a patterned substrate.
Figure 6B:
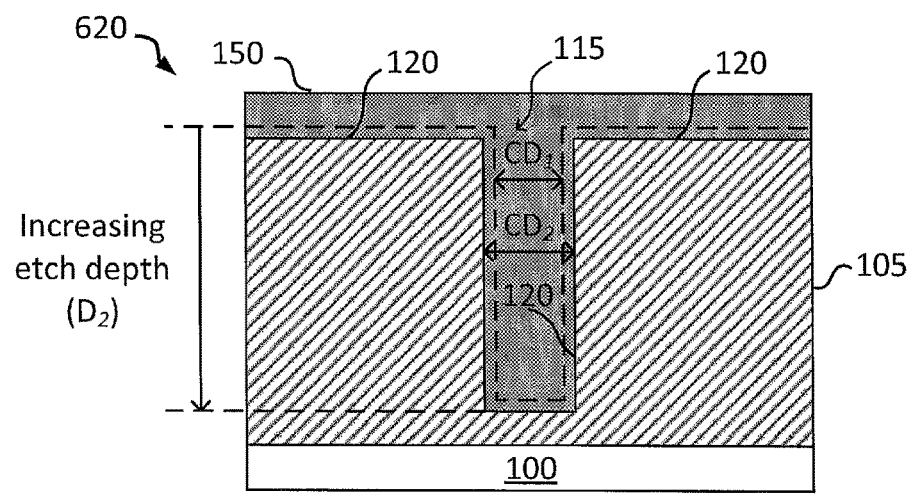
Figure 6C:
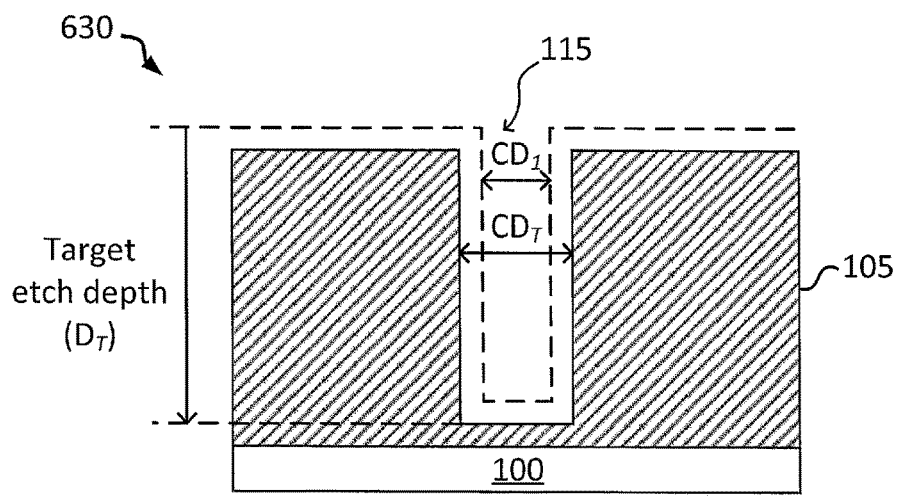

FIGS. 6A-6C illustrate one embodiment of a wet etch process 600 that utilizes the techniques described herein to provide uniform wet etching of material within high aspect ratio features. As described in more detail below, the wet etch process 600 provides uniform wet etching of material within high aspect ratio features by ensuring that the wall surfaces of the material being etched exhibit a neutral surface charge when exposed to the etch solution used to etch the material. In some embodiments, the wet etch process 600 may be performed to etch back material within at least one high aspect ratio feature (e.g., a deep trench or hole), as shown in FIGS. 6A-6C. As described herein, a high aspect ratio feature may have an aspect ratio greater than or equal to 5. It is noted, however, that the wet etch process 600 shown in FIGS. 6A-6C is not strictly limited to the example substrate shown therein and may be applied to a wide variety of substrates and material layers having a wide variety and number of high aspect ratio features formed therein.

As shown in FIG. 6A, the wet etch process 600 may generally begin (in step 610) by providing a patterned substrate 100 having at least one feature 115 formed within a material layer 105 formed on the patterned substrate 100. The material layer 105 may include a wide variety of semiconductor materials. For example, the at least one material layer 105 may be a silicon-containing material (such as, e.g., amorphous silicon (a-Si), polysilicon (poly-Si), silicon dioxide ($SiO_2$), silicon nitride (SiN), silicon carbon nitride (SiCN) or silicon oxynitride (SiON)). Other materials, such as a conductive material (e.g., copper (Cu), aluminum (Al), etc.), may also be utilized for the at least one material layer 105. In some embodiments, the material layer 105 may include a plurality of material layers, wherein one or more of the material layers includes a different material composition.

The at least one feature 115 may include a wide variety of features, such as but not limited to, a deep trench or hole. In some embodiments, the at least one feature 115 may be formed within the material layer 105 using, for example, a dry etch process. The at least one feature 115 formed by the dry etch process may have an initial critical dimension ($CD_1$) and etch depth ($D_1$). As shown in FIG. 6A, the $CD_1$ of the at least one feature 115 may be relatively small (e.g., less than or equal to 100 nm) compared to the etch depth ($D_1$) of the at least one feature 115. In some embodiments, the at least one feature 115 may be a high aspect ratio having an aspect ratio (AR=etch depth:CD) greater than or equal to 5.

After the patterned substrate 100 is provided as shown in FIG. 6A, the wet etch process 600 may expose the patterned substrate 100 to an etch solution 150 to etch back the material layer 105 to increase the CD (e.g., from $CD_1$ to $CD_2$) and/or the etch depth (e.g., from $D_1$ to $D_2$) of the at least one feature 115 (in step 620), as shown in FIG. 6B. The etch solution 150 is selective to the material layer 105. When the patterned substrate 100 is exposed to the etch solution 150, the etch solution 150 reacts with the material layer 105 and promotes dissolution of the reaction products to selectively etch the material layer 105. In some embodiments, the wet etch process 600 may continue etching the material 105 with the etch solution 150 until the at least one feature reaches a target CD ($CD_T$) and/or a target etch depth ($D_T$)(in step 630), as shown in FIG. 6C. In doing so, the wet etch process 600 may provide a uniform etch rate from a top of the at least one feature 115 to the target etch depth.

A wide variety of etch solutions may be utilized in FIG. 6B to etch back the material layer 105 within the at least one feature 115. The etch solution 150 used to etch back the material 105 may generally contain one or more etchant chemicals mixed with an organic solvent and an aqueous solvent (e.g., water ($H_2O$) or deionized water). In some embodiments, the etch solution 150 may contain one or more additional components, such as an acid or base (which may be used to adjust the pH of the etch solution) or a surfactant (which may be used to adjust the Zeta potential between exposed wall surfaces of the feature being etched and the etch solution). The pH value of the etch solution 150 may generally depend on the etchant chemical(s) and the additional components (if any) utilized therein.

The etchant chemical(s) used within the etch solution 150 may generally include anions (negatively charged ions) and cations (positively charged ions). In some embodiments, the etchant chemical(s) used within the etch solution 150 may include anions as the main reactive species. Examples of etchant chemicals containing anions as the main reactive species include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). In other embodiments, the etchant chemical(s) used within the etch solution 150 may include cations as the main reactive species. For example, when $NH_4OH$ is used as the etchant chemical, the cation $NH_4^+$ may sometimes be used as the main reactive species, instead of the anion $OH^-$.

A wide variety of organic solvents may also be utilized within the etch solution 150. Examples of organic solvents include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_6H_{10}O_3$), ethanolamine ($C_2H_7NO$) and propylene glycol methyl ether acetate ($C_6H_{12}O_3$).

In some embodiments, the etch solution 150 may include an etchant chemical containing anions as the main reactive species (e.g., hydrofluoric acid, ammonium hydroxide or hydrochloric acid) mixed with water and an organic solvent. In some embodiments, the organic solvent may be an alcohol (e.g., isopropyl alcohol, IPA), a polyhydric alcohol (e.g., ethylene glycol, EG), acetic acid (AA) or a ketone (e.g., propylene carbonate, PC). In at least one preferred embodiment, the etch solution 150 may include hydrofluoric acid (HF) mixed with water and either IPA, AA, EG or PC. Other organic solvents or other etchant chemicals (such as NH$_4$OH or HCl) described herein may also be used within the etch solution 150. Although the etchant chemicals can be mixed with many different organic solvents, the compatibility and solubility of the etchant chemical(s) and organic solvent must be carefully considered.

When the patterned substrate 100 is exposed to the etch solution 150 in FIG. 6B, exposed portions of the material layer 105 are selectively removed by the etch solution 150. During etching, wall surfaces 120 of the material layer 105 are exposed to the etch solution 150. Unlike the embodiments shown in FIGS. 1A and 1B, however, the wall surfaces 120 exposed to the etch solution 150 do not attain a positive or negative surface charge. Instead, when exposed to the etch solution 150, the wall surfaces 120 of the material 105 being etched exhibit a neutral surface charge at the pH value of the etch solution 150.

As used herein, wall surfaces 120 that exhibit a neutral surface charge when exposed to the etch solution 150 have a Zeta potential that is minimal at the pH value of the etch solution 150. In some cases, the Zeta potential of the wall surfaces 120 may be substantially equal to 0 mV when exposed to the etch solution 150. As used herein, a Zeta potential "substantially equal to 0 mV" may fall within a first range comprising −20 mV to +20 mV, more preferably within a second range comprising −10 mV to +10 mV, and even more preferably within a third range comprising −5 mV to +5 mV. The graph 400 shown in FIG. 4 provides various examples of materials having a Zeta potential substantially equal to 0 mV at various pH. For example, silica (silicon dioxide, SiO$_2$) and polyvinyl alcohol (PVA) are illustrated in FIG. 4 as having a Zeta potential substantially equal to 0 mV when exposed to an etch solution having a pH value of 4. Other materials not explicitly shown and described herein may also exhibit a Zeta potential substantially equal to 0 mV when exposed to etch solutions having similar or different pH.

The etch solution 150 used to selectively etch the at least one material layer 105 may be carefully selected to ensure that the wall surfaces 120 do not attain a surface charge when exposed to the etch solution 150. For example, the constituents of the etch solution 150 (i.e., the etchant chemical(s), organic solvent and aqueous solvent), and the ratios thereof, may be selected (or modified) to ensure that the wall surfaces 120 exhibit electroneutrality (or a neutral surface charge) in the presence of the etch solution 150. In some embodiments, the pH of the etch solution 150 may be adjusted and/or surfactant(s) may be added to the etch solution 150 to adjust the surface potential of the wall surfaces 120 and ensure that the wall surfaces 120 exhibit a neutral surface charge in the presence of the etch solution 150.

Unlike the embodiments shown in FIGS. 1A and 1B, in which wall surfaces 120 of the material 105 being etched exhibit a positive surface charge (e.g., a surface charge substantially greater than 0 mV) or a negative surface charge (e.g., a surface charge substantially less than 0 mV) in the presence of the etch solutions 130 and 140, the wall surfaces 120 of the material 105 being etched in FIG. 6B exhibit a neutral surface charge (e.g., a surface charge substantially equal to 0 mV) when exposed to the etch solution 150. When the wall surfaces 120 of the material 105 being etched are exposed to the etch solution 150, as shown in step 620 of FIG. 6B, the neutral surface charge of the wall surfaces 120 reduces or eliminates electrostatic forces between the wall surfaces 120 and the reactive ion species utilized in the etch solution 150. This enables the wet etch process 600 shown in FIG. 6B to maintain a uniform concentration of reactive ion species within the at least one feature 115 and provide uniform etching of the material 105 along the etch depth (D) of the at least one feature 115.

The wet etch process 600 shown in FIGS. 6A-6C provides uniform wet etching of material 105 within high aspect ratio features (e.g., deep trenches and holes) formed on a patterned substrate 100. In the wet etch process 600, uniform etching is provided along the entire etch depth (D) of the at least one feature 115 by exposing the patterned substrate 100 to an etch solution 150, which prevents the wall surfaces 120 of the material 105 being etched from attaining a surface charge. By ensuring that the wall surfaces 120 of the material 105 being etched exhibit electroneutrality (or a neutral surface charge) when exposed to the etch solution 150, the wet etch process 600 described herein maintains a uniform concentration of reactive ion species within the at least one feature 115 and provides a uniform etch rate from the top of the at least one feature 115 to the target etch depth ($D_T$). This improves etching of material within high aspect ratio features by preventing over/under-etching and reducing CD variations along the depth of the high aspect ratio features.

The wet etch process 600 shown in FIGS. 6A-6C can be used in some applications to etch back the material 105, so as to increase the CD and/or the etch depth of the high aspect ratio feature 115 formed on the patterned substrate 100. It is noted, however, that the techniques described herein are not strictly limited to such applications and can also be used to provide uniform etching of material within a wide variety of features and semiconductor structures utilized in other applications. FIGS. 7A-7C and FIGS. 8A-8C illustrate other embodiments of wet etch processes that utilize the techniques described herein to provide uniform wet etching of material within high aspect ratio features.

Figure 7A:
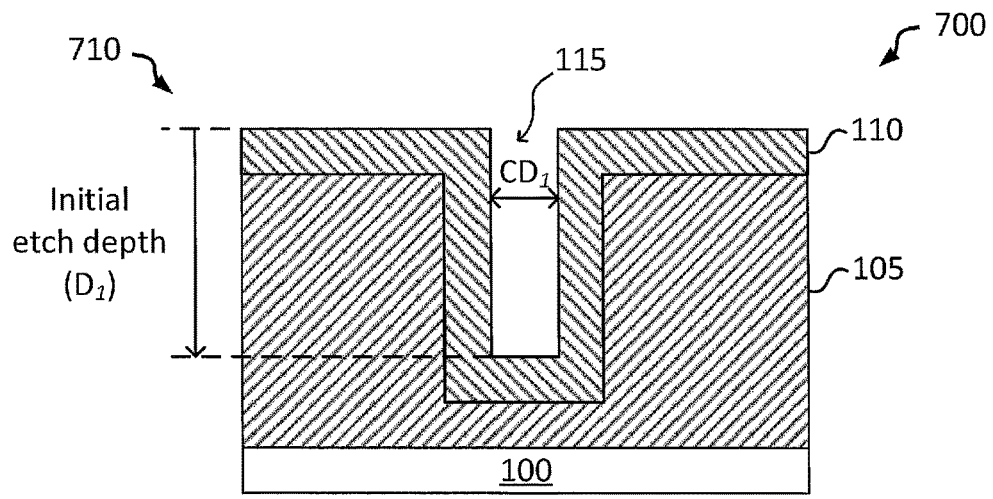
FIGS. 7A-7C illustrate another embodiment of an improved process that uses the techniques described herein to provide uniform wet etching of material within high aspect ratio features provided on a patterned substrate.
Figure 7B:
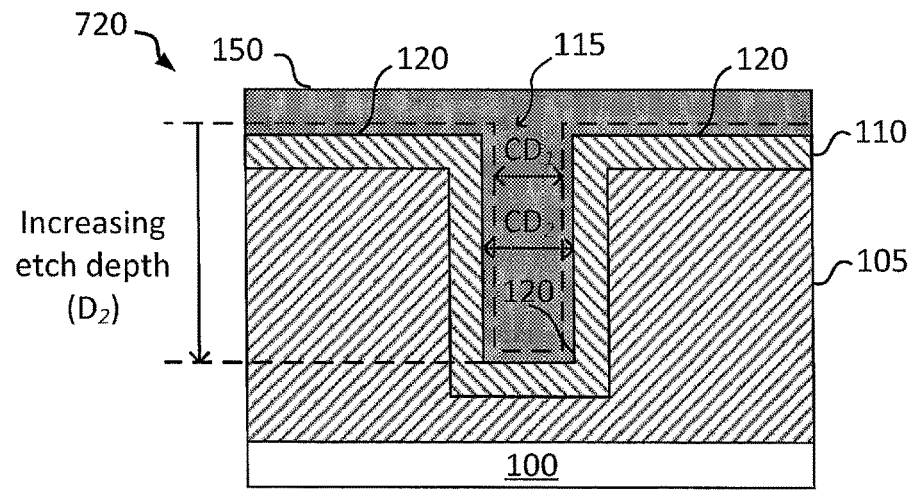
Figure 7C:
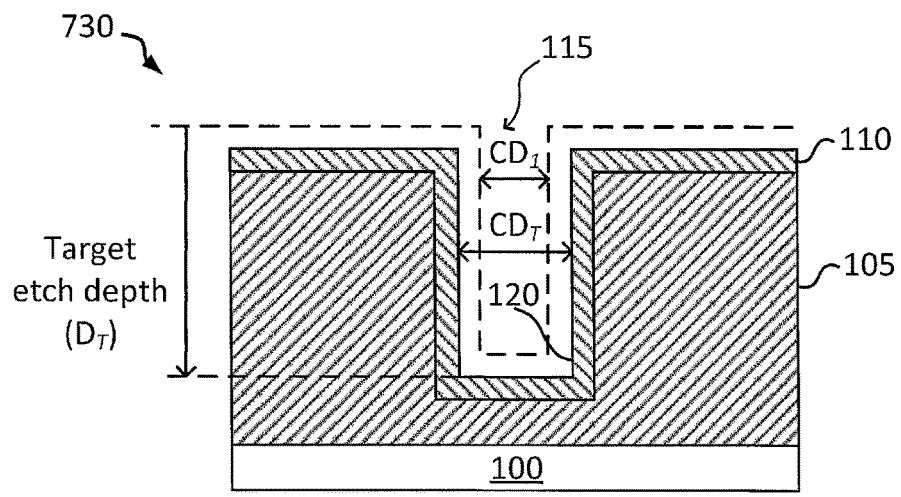

FIGS. 7A-7C illustrate one embodiment of a wet etch process 700 that utilizes the techniques described herein to provide uniform wet etching of material within high aspect ratio features. Like the previous embodiment, the wet etch process 700 provides uniform wet etching of material within high aspect ratio features by ensuring that the wall surfaces of the material being etched exhibit a neutral surface charge when exposed to the etch solution used to etch the material. In the embodiment shown in FIGS. 7A-7C, the wet etch process 700 is used to etch back a material layer, which has been conformally deposited within a high aspect ratio feature (e.g., a deep trench or hole).

As shown in FIG. 7A, the wet etch process 700 may generally begin (in step 710) by providing a patterned substrate 100 having at least one feature 115 formed within a plurality of material layers formed on the patterned substrate 100. In the embodiment shown in FIG. 7A, the at least one feature 115 is initially formed within the material layer 105 using, e.g., a dry etch process. After the at least one feature 115 is formed, another material layer 110 may be conformally deposited on the patterned substrate 100 and within the at least one feature 115 using a wide variety of deposition processes such as, e.g., spin-on, chemical vapor deposition (CVD), physical vapor deposition (PVD), atomic layer deposition (ALD), etc. The material layer 105 and the material layer 110 may each include a wide variety of semiconductor materials. For example, the material layer 105 may be silicon-containing layer such as, e.g., a-Si, poly-Si, SiO$_2$, SiN, SiCN or SiON. The material 110 may be a silicon-containing layer (e.g., $SiO_2$, SiN, SiCN or SiON) or a metal layer (e.g., Cu, Al, etc.).

Like the previous embodiment shown in FIG. 6A, the at least one feature 115 formed in the embodiment shown in FIG. 7A may have an initial critical dimension ($CD_1$) and etch depth ($D_1$). As shown in FIG. 7A, the $CD_1$ of the at least one feature 115 may be relatively small (e.g., less than or equal to 100 nm) compared to the etch depth ($D_1$) of the at least one feature 115. In some embodiments, the at least one feature 115 may be a high aspect ratio having an aspect ratio (AR=etch depth:CD) greater than or equal to 5.

After the patterned substrate 100 is provided as shown in FIG. 7A, the wet etch process 700 may expose the patterned substrate 100 to an etch solution 150 to etch back the material layer 110 to increase the CD (e.g., from $CD_1$ to $CD_2$) and/or the etch depth (e.g., from $D_1$ to $D_2$) of the at least one feature 115 (in step 720), as shown in FIG. 7B. The etch solution 150 is selective to the material layer 110. When the patterned substrate 100 is exposed to the etch solution 150, the etch solution 150 reacts with the material layer 110 and promotes dissolution of the reaction products to selectively etch the material layer 110. In some embodiments, the wet etch process 700 may continue etching the material 110 with the etch solution 150 until the at least one feature 115 reaches a target CD ($CD_T$) and/or a target etch depth ($D_T$) (in step 730), as shown in FIG. 7C. In doing so, the wet etch process 700 may provide a uniform etch rate from a top of the at least one feature 115 to the target etch depth.

Like the previous embodiment shown in FIGS. 6A-6C, the wet etch process 700 shown in FIGS. 7A-7C provides uniform wet etching of material 110 within high aspect ratio features (e.g., deep trenches and holes) formed on a patterned substrate 100 by ensuring that the wall surfaces 120 of the material 110 being etched exhibit a neutral surface charge when exposed to the etch solution 150 used to etch the material 110. The etch solution 150 used to etch the material 110 may generally include one or more etchant chemicals mixed with an organic solvent and an aqueous solvent. As noted above, the constituents of the etch solution 150 (i.e., the etchant chemical(s), organic solvent and aqueous solvent), and the ratios thereof, may be selected (or modified) to ensure that the wall surfaces 120 exhibit electroneutrality (or a neutral surface charge) in the presence of the etch solution 150. In some embodiments, the pH of the etch solution 150 may be adjusted and/or surfactant(s) may be added to the etch solution 150 to adjust the surface potential of the wall surfaces 120 and ensure that the wall surfaces 120 exhibit a neutral surface charge in the presence of the etch solution 150.

In the wet etch process 700, uniform etching is provided along the entire etch depth (D) of the at least one feature 115 by exposing the patterned substrate 100 to an etch solution 150, which prevents the wall surfaces 120 of the material layer 110 being etched from attaining a surface charge. By ensuring that the wall surfaces 120 of the material layer 110 being etched exhibit electroneutrality (or a neutral surface charge) when exposed to the etch solution 150, the wet etch process 700 described herein maintains a uniform concentration of reactive ion species within the at least one feature 115 and provides a uniform etch rate from the top of the at least one feature 115 to the target etch depth ($D_T$). This improves etching of material within high aspect ratio features by preventing over/under-etching and reducing CD variations along the depth of the high aspect ratio features.

Figure 8A:
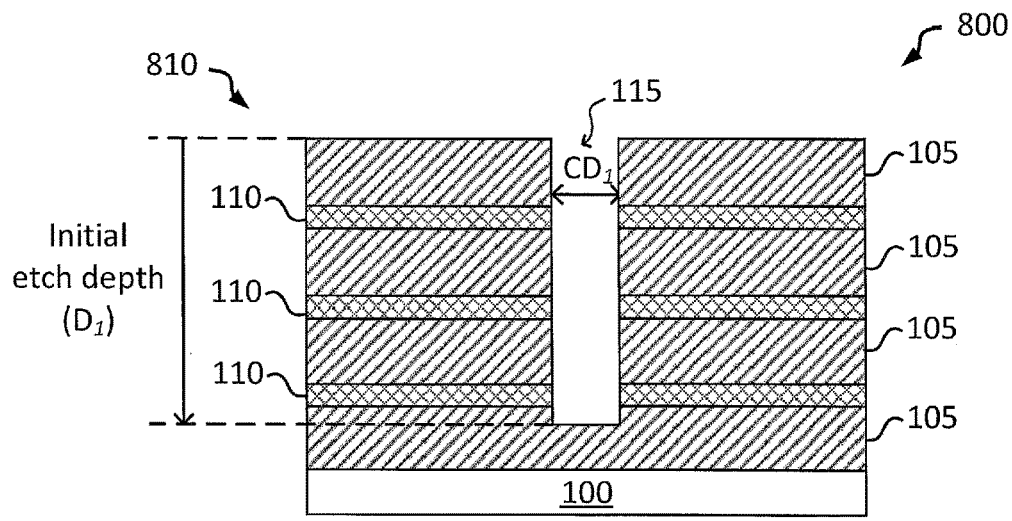
FIGS. 8A-8C illustrate yet another embodiment of an improved process that uses the techniques described herein to provide uniform wet etching of material within high aspect ratio features provided on a patterned substrate.
Figure 8B:
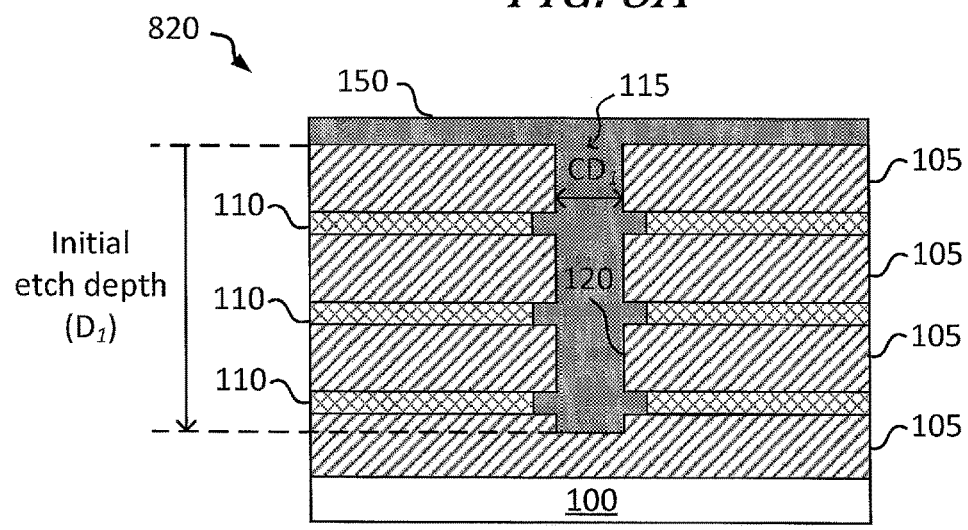
Figure 8C:
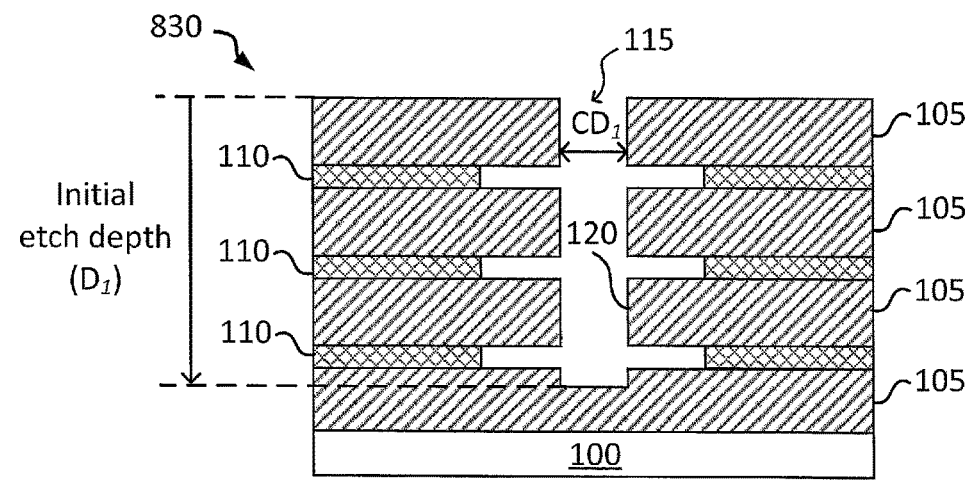

FIGS. 8A-8C illustrate yet another embodiment of a wet etch process 800 that utilizes the techniques described herein to provide uniform wet etching of material within high aspect ratio features. Unlike the previous embodiments shown in FIGS. 6A-6C and 7A-7C, the wet etch process 800 shown in FIGS. 8A-8C provides uniform wet etching of material within high aspect ratio features by ensuring that the wall surfaces adjacent to the material being etched exhibit a neutral surface charge when exposed to the etch solution used to etch the material. In the embodiment shown in FIGS. 8A-8C, a high aspect ratio feature (e.g., a deep trench or hole) is formed within a stack of material layers, including alternating layers of a first material layer and a second material layer, and the wet etch process 800 is used to etch back (or completely remove) the second material layer without etching the first material layer.

As shown in FIG. 8A, the wet etch process 800 may generally begin (in step 810) by providing a patterned substrate 100 having at least one feature 115 formed within a stack of material layers comprising alternating layers of a first material layer 105 and a second material layer 110. In the embodiment shown in FIG. 8A, the at least one feature 115 may be initially formed within the stack of material layers using, e.g., a dry etch process. The material layer 105 and the material layer 110 may each include a wide variety of semiconductor materials. For example, the material layer 105 may be a first silicon-containing layer such as, e.g., a-Si, poly-Si, or $SiO_2$. The material 110 may be a second silicon-containing layer such as, e.g., SiN or silicon geranium (SiGe). The second silicon-containing layer may generally differ from the first silicon-containing layer.

The material composition of the material layer 105 and the material layer 110 may generally depend on the semiconductor device being formed. For example, the material layer 105 may be silicon dioxide ($SiO_2$) and the material layer 110 may be silicon nitride (SiN) when forming a three-dimensional (3D) memory device, such as a 3D NAND memory device. On the other hand, the material layer 105 may be silicon (e.g., a-Si or poly-Si) and the material layer 110 may be silicon geranium (SiGe) when forming a transistor nanosheet. Other silicon-containing materials can also be used to form a stack of material layers, as is known in the art.

Like the previous embodiments shown in FIGS. 6A and 7A, the at least one feature 115 formed in the embodiment shown in FIG. 8A may have an initial critical dimension ($CD_1$) and etch depth ($D_1$). As shown in FIG. 8A, the $CD_1$ of the at least one feature 115 may be relatively small (e.g., less than or equal to 100 nm) compared to the etch depth ($D_1$) of the at least one feature 115. In some embodiments, the at least one feature 115 may be a high aspect ratio having an aspect ratio (AR=etch depth:CD) greater than or equal to 5.

After the patterned substrate 100 is provided as shown in FIG. 8A, the wet etch process 800 may expose the patterned substrate 100 to an etch solution 150 to etch the second material layer 110 without etching the first material layer 105 (in step 820), as shown in FIG. 8B. The etch solution 150 is selective to the second material layer 110. When the patterned substrate 100 is exposed to the etch solution 150, the etch solution 150 reacts with the second material layer 110 and promotes dissolution of the reaction products to selectively etch the second material layer 110 without etching the first material layer 105. Because the etch solution 150 is highly selective to the second material layer 110, the wet etch process 800 does not increase the critical dimension ($CD_1$) or the etch depth ($D_1$) of the at least one feature 115. Instead, the wet etch process 800 may continue etching the second material layer 110 with the etch solution 150 to etch back or remove portions of the second material layer 110 (in step 830), as shown in FIG. 8C. In other embodiments (not shown), the wet etch process 800 may continue etching the second material layer 110 with the etch solution 150 until the second material layer 110 is completely removed.

In the wet etch process 800, uniform etching is provided along the entire etch depth ($D_1$) of the at least one feature 115 by exposing the patterned substrate 100 to an etch solution 150, which prevents the wall surfaces 120 adjacent to the second material layer 110 being etched from attaining a surface charge. By ensuring that the wall surfaces 120 adjacent to the second material layer 110 being etched exhibit electroneutrality (or a neutral surface charge) when exposed to the etch solution 150, the wet etch process 800 described herein maintains a uniform concentration of reactive ion species within the at least one feature 115 and provides uniform etching of the second material layer 110 along the depth ($D_1$) of the at least one feature 115. This improves etching of material within high aspect ratio features by preventing over/under-etching and reducing CD variations along the depth of the high aspect ratio features.

The wet etch processes 600, 700 and 800 disclosed herein provide uniform etching of material within high aspect ratio features formed on a patterned substrate. It is recognized that the wet etch processes 600, 700 and 800 disclosed herein may be utilized during the processing of a wide range of substrates. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures, features and layers, all of which are known in the substrate processing art, and which may be considered to be part of the substrate. For example, in one embodiment, the substrate may be a semiconductor wafer having one or more semiconductor processing layers formed thereon. The concepts disclosed herein may be utilized at any stage of the substrate process flow.

Figure 9:
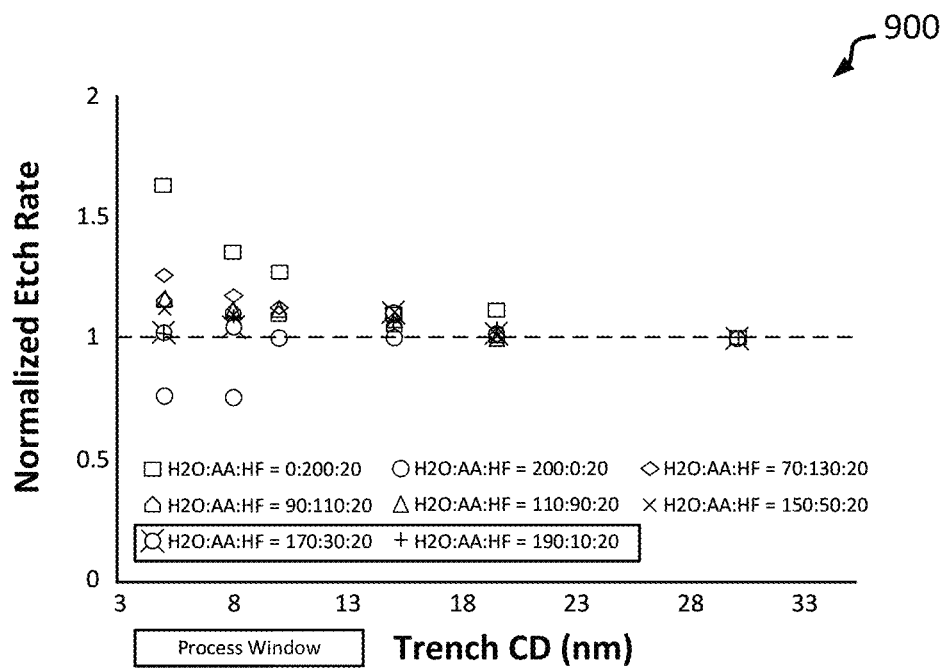
FIG. 9 is a graph illustrating normalized etch rate vs trench CD (expressed in nm) when an etch solution having one or more etchant chemicals, an aqueous solvent and an organic solvent (e.g., acetic acid) is used to etch trenches of varying CD within a SiCN layer.

The graph 900 shown in FIG. 9 illustrates normalized etch rate vs trench CD (expressed in nm) when an etch solution 150 having one or more etchant chemicals, an organic solvent (e.g., acetic acid) and an aqueous solvent is utilized to etch trenches of varying CD within a SiCN layer. In the graph 900, the "normalized etch rate" is the ratio of the etch rate in trenches having smaller CD to the etch rate in trenches having larger CD. As shown in the graph 900, the normalized etch rate increases with decreasing CD when using an etch solution having an organic solvent (e.g., $H_2O$:AA:HF=0:200:20), and decreases with decreasing CD when using an etch solution having an aqueous solvent (e.g., $H_2O$:AA:HF=200:0:20). However, when the substrate is exposed to an etch solution having both an aqueous solvent and an organic solvent, a uniform etch rate (e.g., a normalized etch rate close to "1") is provided within the trenches of varying CD.

The graph 900 shown in FIG. 9 depicts the normalized etch rate vs trench CD for a variety of different etch solutions, which mix water ($H_2O$) and acetic acid (AA) with hydrofluoric acid (HF). For example, the graph 900 depicts the normalized etch rate vs trench CD for: (a) a first etch solution (denoted with a □) that combines $H_2O$, AA and HF at a ratio of 0:200:20, (b) a second etch solution (denoted with a ○) that combines $H_2O$, AA and HF at a ratio of 200:0:20, (c) a third etch solution (denoted with a ◊) that combines $H_2O$, AA and HF at a ratio of 70:130:20, (d) a fourth etch solution (denoted with a △) that combines $H_2O$, AA and HF at a ratio of 90:110:20, (e) a fifth etch solution (denoted with a blue-A) that combines $H_2O$, AA and HF at a ratio of 110:90:20, (f) a sixth etch solution (denoted with a x) that combines $H_2O$, AA and HF at a ratio of 150:50:20, (g) a seventh etch solution (denoted with a black ¤) that combines $H_2O$, AA and HF at a ratio of 170:30:20, and (h) an eighth etch solution (denoted with a +) that combines $H_2O$, AA and HF at a ratio of 190:10:20. Of these etch solutions, the seventh etch solution (denoted with a ¤) and the eighth etch solution (denoted with a +) meet the process window requirements for uniform etch rate within the trenches of varying CD.

Figure 10:
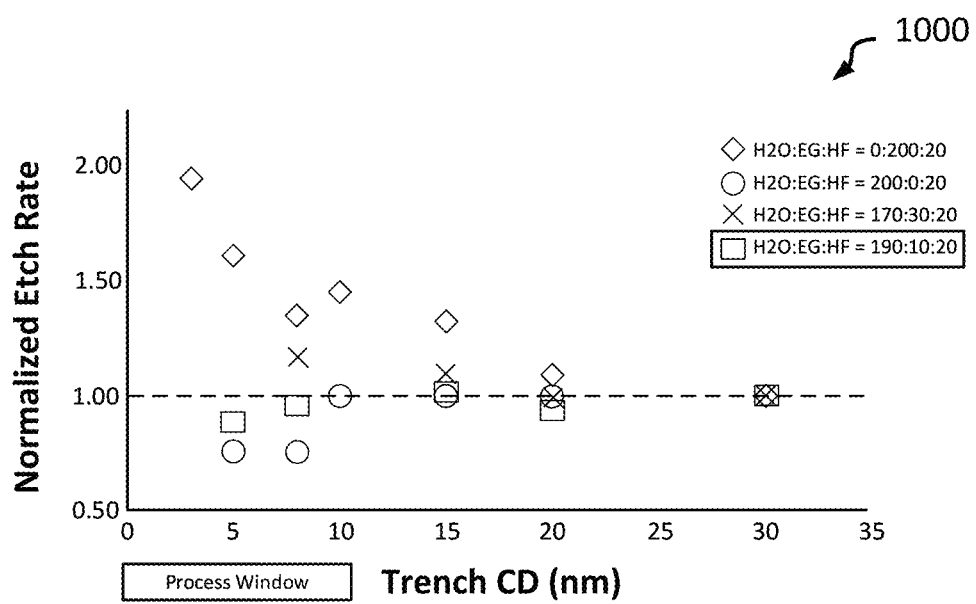
FIG. 10 is a graph illustrating normalized etch rate vs trench CD (expressed in nm) when another etch solution having one or more etchant chemicals, an aqueous solvent and an organic solvent (e.g., ethylene glycol) is used to etch trenches of varying CD within a SiCN layer.

The graph 1000 shown in FIG. 10 illustrates normalized etch rate vs trench CD (expressed in nm) when another etch solution 150 having one or more etchant chemicals, an organic solvent (e.g., ethylene glycol) and an aqueous solvent is utilized to etch trenches of varying CD within a SiCN layer. Similar to the graph 900 shown in FIG. 9, the graph 1000 shown in FIG. 10 shows the normalized etch rate increases with decreasing CD when using an etch solution having an organic solvent (e.g., $H_2O$:EG:HF=0:200:20), and decreases with decreasing CD when using an etch solution having an aqueous solvent (e.g., $H_2O$:EG:HF=200:0:20). However, when the substrate is exposed to an etch solution having both an aqueous solvent and an organic solvent, a uniform etch rate (e.g., a normalized etch rate close to "1") is provided within the trenches of varying CD.

The graph 1000 shown in FIG. 10 depicts the normalized etch rate vs trench CD for a variety of different etch solutions, which mix water ($H_2O$) and ethylene glycol (EG) with hydrofluoric acid (HF). For example, the graph 1000 depicts the normalized etch rate vs trench CD for: (a) a first etch solution (denoted with a blue ◊) that combines $H_2O$, EG and HF at a ratio of 0:200:20, (b) a second etch solution (denoted with a ○) that combines $H_2O$, EG and HF at a ratio of 200:0:20, (c) a third etch solution (denoted with x) that combines $H_2O$, EG and HF at a ratio of 170:30:20, and (d) a fourth etch solution (denoted with a □) that combines $H_2O$, EG and HF at a ratio of 190:10:20. Of these etch solutions, the fourth etch solution (denoted with a □) meet the process window requirements for uniform etch rate within the trenches of varying CD.

Although the graphs 900 and 1000 provide example etch solutions that meet the process window requirements for uniform etch rate within the trenches of varying CD, the same or similar etch solutions may also be used in the wet etch processes described herein to provide a uniform etch rate of material within high aspect ratio features, such as deep trenches and holes having an aspect ratio greater than or equal to 5. This is because the same mechanism (e.g., the electric double layer, or EDL) may play a part in both CD-dependent etching within features of different CD and AR-dependent etching within features having high aspect ratio. By providing an etch solution that avoids generating an electric double layer (EDL) between wall surfaces of a material being etched (or wall surfaces adjacent to a material being etched) and the etch solution, a uniform etch rate is provided in both features of different CD and high aspect ratio features.

As described herein, one mechanism that may cause the variation in etch rates when using the various etch solutions, wall materials, CDs and aspect ratios is a mechanism related to surface potentials. However, the techniques described herein are not strictly limited to such techniques. Thus, the CD and AR independent etch rates described herein may be accomplished through other mechanisms and the etch rate advantages described and obtained with the techniques provided herein are not limited to the particular surface potential mechanisms described above. Rather, the advantages may be obtained utilizing other mechanisms also.

Figure 11:
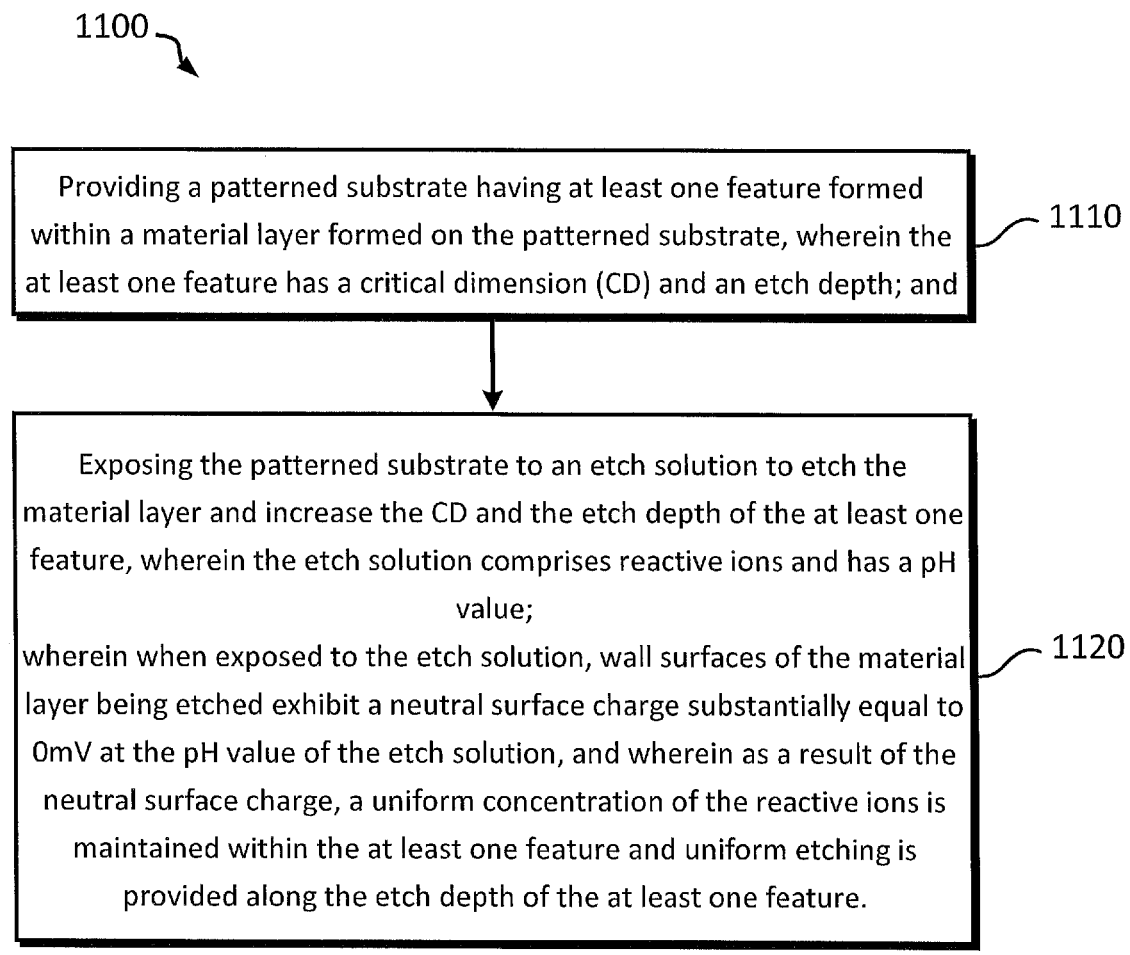
FIG. 11 is a flowchart diagram illustrating one embodiment of a method of etching that utilizes the techniques described herein.

FIGS. 11-12 illustrate exemplary methods that utilize the techniques described herein to provide uniform etching of material within high aspect ratio features formed on a patterned substrate, such as but not limited to, the patterned substrate 100 shown in FIGS. 6A-6C, FIGS. 7A-7C and FIGS. 8A-8C. It will be recognized that the embodiments shown in FIGS. 11-12 are merely exemplary and additional methods may utilize the techniques described herein. Further, additional processing steps may be added to the methods shown in FIGS. 11-12 as the steps described are not intended to be exclusive. Moreover, the order of the steps is not limited to the order shown in the figures as different orders may occur and/or various steps may be performed in combination or at the same time.

FIG. 11 illustrates a method 1100 of etching, in accordance with one embodiment of the present disclosure. The method 1100 shown in FIG. 11 may generally be used to provide uniform wet etching of material within high aspect ratio features (e.g., deep trenches and holes) formed on a patterned substrate by ensuring that the wall surfaces of the material being etched exhibit a neutral surface charge when exposed to the etch solution used to etch the material, as shown for example in FIGS. 6A-6C and FIGS. 7A-7C.

In some embodiments, the method 1100 shown in FIG. 11 may begin (in step 1110) by providing a patterned substrate having at least one feature formed within a material layer formed on the patterned substrate. The at least one feature formed within a material layer may have a critical dimension (CD) and an etch depth. Next, the method 1100 may expose the patterned substrate to an etch solution to etch the material layer and increase the CD and the etch depth of the at least one feature (in step 1120). The etch solution may include reactive ions and may have a pH value, as described above. When exposed to the etch solution (in step 1120), wall surfaces of the material layer being etched may exhibit a neutral surface charge substantially equal to 0 mV at the pH value of the etch solution. As a result of the neutral surface charge, the method 1100 may maintain a uniform concentration of the reactive ions within the at least one feature and provide uniform etching along the etch depth of the at least one feature. In some embodiments, the method 1100 may continue etching the material layer until the at least one feature reaches a target etch depth. In such embodiments, the method 1100 may provide a uniform etch rate from a top of the at least one feature to the target etch depth.

The material layer being etched (in step 1120) may include a wide variety of semiconductor materials. In some embodiments, for example, the material layer being etched (in step 1120) may include a silicon-containing layer or a metal layer. Examples of silicon-containing layers include, but are not limited to, amorphous silicon (a-Si), polysilicon (poly-Si), silicon dioxide (SiO2), silicon nitride (SiN), silicon carbon nitride (SiCN) and silicon oxynitride (SiON).

FIG. 12 illustrates a method 1200 of etching, in accordance with another embodiment of the present disclosure. The method 1200 shown in FIG. 12 may generally be used to provide uniform wet etching of material within high aspect ratio features (e.g., deep trenches and holes) formed on a patterned substrate by ensuring that the wall surfaces adjacent to the material being etched exhibit a neutral surface charge when exposed to the etch solution used to etch the material, as shown for example in FIGS. 8A-8C.

The method 1200 shown in FIG. 12 may begin (in step 1210) by providing a patterned substrate having at least one feature formed within a stack of material layers comprising alternating layers of a first material layer and a second material layer. Next, the method 1200 may expose the patterned substrate to an etch solution to etch the second material layer without etching the first material layer (in step 1220). The etch solution may include reactive ions and may have a pH value, as described above. When exposed to the etch solution (in step 1220), wall surfaces of the first material layer adjacent to the second material layer being etched may exhibit a neutral surface charge substantially equal to 0 mV at the pH of the etch solution. This enables the method 1000 to maintain a uniform concentration of the reactive ions within the at least one feature and provide uniform etching along the depth of the at least one feature.

The first material layer and the second material layer may each include a wide variety of semiconductor materials. In some embodiments, the first material layer may include a first silicon-containing layer and the second material layer may include a second silicon-containing layer that differs from the first silicon-containing layer. As noted above, the material composition of the first material layer and the second material layer may generally depend on the semiconductor device being formed. For example, the first material layer may be silicon dioxide ($SiO_2$) and the second material layer may be silicon nitride (SiN) when forming a three-dimensional (3D) memory device, such as a 3D NAND memory device. On the other hand, the first material layer may be silicon (e.g., a-Si or poly-Si) and the second material layer may be silicon geranium (SiGe) when forming a transistor nanosheet. Other silicon-containing materials can also be used to form a stack of material layers, as is known in the art.

In some embodiments, the etch solution used within the method 1100 and the method 1200 may include one or more etchant chemicals, an organic solvent and an aqueous solvent. For example, the one or more etchant chemicals may include one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may include one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$). The aqueous solvent may include water ($H_2O$) or deionized water.

As noted above, the constituents of the etch solution (i.e., the etchant chemical(s), organic solvent and aqueous solvent), and the ratios thereof, may be selected to selectively etch the material layer (in step 1120 of FIG. 11) or the second material layer (in step 1220 of FIG. 12). The etch solution may also be selected (or modified) to ensure that the wall surfaces of the material layer being etched (in step 1120 of FIG. 11) or the wall surfaces of the first material layer adjacent to the second material layer being etched (in step 1220 of FIG. 12) exhibit electroneutrality (or a neutral surface charge) in the presence of the etch solution. In some embodiments, the method 1100 and/or the method 1200 may further include adjusting the pH value of the etch solution to ensure that the wall surfaces of the material layer being etched (in step 1120 of FIG. 11) or the wall surfaces of the first material layer adjacent to the second material layer being etched (in step 1220 of FIG. 12) exhibit the neutral surface charge at the pH value of the etch solution. In other embodiments, the method 1100 and/or the method 1200 may further include adding a surfactant to the etch solution to ensure that the wall surfaces of the material layer being etched (in step 1120 of FIG. 11) or the wall surfaces of the first material layer adjacent to the second material layer being etched (in step 1220 of FIG. 12) exhibit the neutral surface charge at the pH value of the etch solution.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Wet etch processes and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described wet etch processes and methods will be apparent to those skilled in the art in view of this description. It will be recognized, therefore, that the described wet etch processes and methods are not limited by the examples described herein. It is to be understood that the forms of the processes and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of etching, the method comprising:
   providing a patterned substrate having at least one feature formed within a material layer formed on the patterned substrate, wherein the at least one feature has a critical dimension (CD) and an etch depth; and
   exposing the patterned substrate to an etch solution to etch the material layer and increase the CD and the etch depth of the at least one feature, wherein the etch solution comprises reactive ions and has a pH value;
   wherein when exposed to the etch solution, wall surfaces of the material layer being etched exhibit a neutral surface charge substantially equal to 0 mV at the pH value of the etch solution, and wherein as a result of the neutral surface charge, a uniform concentration of the reactive ions is maintained within the at least one feature and uniform etching is provided along the etch depth of the at least one feature.

2. The method of claim 1, further comprising continuing etching the material layer with the etch solution until the at least one feature reaches a target etch depth, wherein said exposing the substrate to the etch solution and said continuing etching the material layer with the etch solution provides a uniform etch rate from a top of the at least one feature to the target etch depth.

3. The method of claim 1, wherein the etch solution comprises one or more etchant chemicals, an organic solvent and an aqueous solvent, and wherein the method comprises selecting the one or more etchant chemicals, the organic solvent and the aqueous solvent prior to exposing the patterned substrate to the etch solution to ensure that the wall surfaces of the material layer being etched exhibit the neutral surface charge at the pH value of the etch solution.

4. The method of claim 3, wherein the one or more etchant chemicals comprise one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

5. The method of claim 3, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

6. The method of claim 1, wherein the at least one feature has an aspect ratio greater than or equal to 5.

7. The method of claim 1, further comprising adjusting the pH value of the etch solution prior to exposing the patterned substrate to the etch solution to ensure that the wall surfaces of the material layer being etched exhibit the neutral surface charge at the pH value of the etch solution.

8. The method of claim 1, further comprising adding a surfactant to the etch solution prior to exposing the patterned substrate to the etch solution to ensure that the wall surfaces of the material layer being etched exhibit the neutral surface charge at the pH value of the etch solution.

9. The method of claim 1, wherein the material layer comprises a silicon-containing layer or a metal layer.

10. The method of claim 9, wherein the silicon-containing layer comprises amorphous silicon (a-Si), polysilicon (poly-Si), silicon nitride (SiN), silicon carbon nitride (SiCN) or silicon oxynitride (SiON).

11. The method of claim 9, wherein the etch solution comprises one or more etchant chemicals mixed with an organic solvent and an aqueous solvent.

12. The method of claim 11, wherein the one or more etchant chemicals comprise one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH), wherein the aqueous solvent is water, and wherein the organic solvent is isopropyl alcohol ($C_3H_8O$), propylene carbonate ($C_4H_6O_3$), acetic acid ($CH_3COOH$) or ethylene glycol ($C_2H_6O_2$).

13. A method of etching, the method comprising:
providing a patterned substrate having at least one feature formed within a stack of material layers comprising alternating layers of a first material layer and a second material layer; and
exposing the patterned substrate to an etch solution to etch the second material layer without etching the first material layer, wherein the etch solution comprises reactive ions and has a pH value;
wherein when exposed to the etch solution, wall surfaces of the first material layer adjacent to the second material layer being etched exhibit a neutral surface charge substantially equal to 0 mV at the pH of the etch solution, and wherein as a result of the neutral surface charge, a uniform concentration of the reactive ions is maintained within the at least one feature and uniform etching of the second material layer is provided along a depth of the at least one feature.

14. The method of claim 13, wherein the etch solution comprises one or more etchant chemicals mixed with an organic solvent and an aqueous solvent, and wherein the method comprises selecting the one or more etchant chemicals, the organic solvent and the aqueous solvent prior to exposing the patterned substrate to the etch solution to ensure that the wall surfaces of the material layer being etched exhibit the neutral surface charge at the pH value of the etch solution.

15. The method of claim 14, wherein the one or more etchant chemicals comprise one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

16. The method of claim 14, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

17. The method of claim 13, further comprising adjusting the pH value of the etch solution prior to exposing the patterned substrate to the etch solution to ensure that the wall surfaces of the first material layer exhibit the neutral surface charge at the pH value of the etch solution.

18. The method of claim 13, further comprising adding a surfactant to the etch solution prior to exposing the patterned substrate to the etch solution to ensure that the wall surfaces of the first material layer exhibit the neutral surface charge at the pH value of the etch solution.

19. The method of claim 13, wherein the stack of material layers comprise alternating layers of a first silicon-containing layer and a second silicon-containing layer utilized within a three-dimensional memory device, and wherein the second silicon-containing layer differs from the first silicon-containing layer.

20. The method of claim 13, wherein the stack of material layers comprise alternating layers of a first silicon-containing layer and a second silicon-containing layer utilized within a transistor nano-sheet, and wherein the second silicon-containing layer differs from the first silicon-containing layer.

* * * * *

UNITED STATES PATENT AND TRADEMARK OFFICE
CERTIFICATE OF CORRECTION

| | | |
|---|---|---|
| PATENT NO. | : 12,243,749 B2 | Page 1 of 1 |
| APPLICATION NO. | : 17/952613 | |
| DATED | : March 4, 2025 | |
| INVENTOR(S) | : Shan Hu et al. | |

It is certified that error appears in the above-identified patent and that said Letters Patent is hereby corrected as shown below:

In the Claims

In Claim 5, Column 23, Line 7, delete "$(C_4H_{8O})$" and insert --$(C_4H_8O)$--

Signed and Sealed this
Fifteenth Day of April, 2025

Coke Morgan Stewart
*Acting Director of the United States Patent and Trademark Office*